United States Patent
Cho et al.

(10) Patent No.: US 6,723,587 B2
(45) Date of Patent: Apr. 20, 2004

(54) ULTRA SMALL-SIZED SOI MOSFET AND METHOD OF FABRICATING THE SAME

(75) Inventors: Won-Ju Cho, Daejeon (KR);
Jong-Heon Yang, Daejeon (KR);
Moon-Gyu Jang, Daejeon (KR);
Seong-Jae Lee, Daejeon (KR);
Kyoung-Wan Park, Daejeon (KR);
Ki-Ju Im, Daejeon (KR); Ji-Hun Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/331,568

(22) Filed: Dec. 31, 2002

(65) Prior Publication Data

US 2004/0056307 A1 Mar. 25, 2004

(30) Foreign Application Priority Data

Sep. 19, 2002 (KR) ................. 10-2002-0057329

(51) Int. Cl.[7] .......................... H01L 21/84; H01L 21/00
(52) U.S. Cl. ................. 438/151; 438/153; 438/154; 438/197; 438/542; 438/558; 438/559; 438/563
(58) Field of Search ................ 438/151, 153, 438/154, 197, 542, 558, 559, 563

(56) References Cited

U.S. PATENT DOCUMENTS

| | | | |
|---|---|---|---|
| 5,888,856 A | * | 3/1999 | Hamada ..................... 438/162 |
| 5,903,013 A | * | 5/1999 | Park ............................ 257/57 |
| 6,033,963 A | | 3/2000 | Huang et al. |
| 6,225,173 B1 | | 5/2001 | Bin Yu |
| 6,271,064 B2 | * | 8/2001 | Park ............................ 438/159 |
| 6,333,245 B1 | * | 12/2001 | Furukawa et al. ........... 438/542 |

OTHER PUBLICATIONS

A. Chatterjee, et al.; "Sub–100nm Gate Length Metal Gate NMOS Transistors Fabricated by a Replacement Gate Process"; 1997 IEEE; pp. 821–824.

H–H. Vuong, et al.; "Design of 25–nm SALVO PMOS Devices"; IEEE Electron Device Letters; vol. 21, No. 5; May 2000; pp. 248–250.

* cited by examiner

Primary Examiner—Long Pham
(74) Attorney, Agent, or Firm—Jacobson Holman PLLC

(57) ABSTRACT

An ultra small-sized SOI MOSFET having a high integration density, low power consumption, but high performances, and a method of fabricating the same are provided. The method includes preparing a SOI substrate on which a monocrystalline silicon layer is formed, forming a first dielectric material layer doped with impurities of a first conductivity type on the SOI substrate, forming an opening to expose the monocrystalline silicon layer etching at least part of the first dielectric material layer, forming a channel region injecting impurities of a second conductivity type into the monocrystalline silicon layer exposed by the opening, forming a source region and a drain region in the monocrystalline silicon layer diffusing the impurities of the first dielectric material layer using heat treatment, forming a gate dielectric layer in the opening on the channel region, forming a gate electrode on the gate dielectric layer to fit in the opening, forming a second dielectric material layer on the entire surface of the SOI substrate on which the gate electrode is formed, forming contact holes to expose the gate electrode, the source region, and the drain region etching part of the second dielectric material layer, and forming metal interconnections to bury the contact holes.

7 Claims, 6 Drawing Sheets

ULTRA SMALL-SIZED SOI MOSFET AND METHOD OF FABRICATING THE SAME

BACKGROUND OF THE INVENTION

1. Field of the Invention

The present invention relates to a metal oxide semiconductor field effect transistor (MOSFET), and more particularly, to an ultra small-sized SOI MOSFET and a method of fabricating the same.

2. Description of the Related Art

The size of silicon semiconductor devices has been decreasing more and more so as to meet the needs of low power consumption, high integration density, and high-speed operation. In particular, metal oxide semiconductor field effect transistors (MOSFETs) have been strongly required to have shorter channels, shallower junctions in source and drain regions, and thinner gate dielectric layers. Furthermore, semiconductor devices must be manufactured to have high performances by increasing the driving current while decreasing the leakage current. According to a conventional method of manufacturing a MOSFET, a gate dielectric layer is formed on a monocrystalline silicon substrate where an isolation region has already been formed to surround an activated region of a semiconductor device, and a conductive layer and a dielectric mask layer are sequentially deposited on the gate dielectric layer. Next, a gate electrode pattern is formed performing photolithography on the conductive layer and the dielectric mask layer. Next, impurity ions are implanted into the substrate using the gate electrode pattern as an ion implantation mask, and an interlayer dielectric layer is formed on the entire surface of the substrate. Next, contact holes are formed to expose a source region, a drain region, and a gate electrode, and a MOS transistor is completely formed using a metal wiring process.

Junction isolation in a bulk silicon substrate, which has been used to manufacture such a conventional silicon integrated circuit, may cause junction breakdown in a case where a pressure of about ±30 V is supplied under conventional doping levels and dimensions. Accordingly, junction isolation is not appropriate for high voltage applications. In addition, junction isolation is not effective in a high radioactive environment because of transient photocurrent generated in a pn junction by gamma rays. In order to overcome the disadvantages of junction isolation, a silicon on insulator (SOI) technique, by which a device is completely surrounded not by a pn junction but by an insulator, has been developed. A circuit manufactured using a SOI substrate can have a smaller size and a simpler structure than a circuit manufactured using a bulk silicon substrate. In addition, it is much simpler to manufacture a circuit using such a SOI technique. This technique still has another advantage: the operation speed of a circuit manufactured using this technique is fast due to the decrease in parasitic capacitance. However, even though such a SOI substrate is used, a MOS transistor has been manufactured in the conventional way in which source and drain regions are formed using ion implantation after formation of gate electrode patterns, as described above.

However, there are a lot of limits in manufacturing an ultra small-sized silicon device having high performances, using the conventional method of manufacturing a MOS transistor. In order to manufacture an ultra small-sized device having channels of several nano meters on a plane which is a conventional device structure, new techniques for forming patterns, such as direct patterning using electron beams, EUV exposure, or X-ray exposure, must be used. Accordingly, the manufacturing costs of silicon devices increase, and the mass production of silicon devices becomes more difficult.

In addition, it is very difficult to form very shallow junctions using conventional techniques for forming source and drain regions, such as ion implantation or plasma doping. A substrate may be damaged during ion implantation, which deteriorates the characteristics of a device. In addition, an expensive junction forming apparatus is necessary. In addition, as the size of devices becomes smaller, a problem of the conventional junction forming techniques with gate leakage current, which is caused due to the decrease in the thickness of a gate oxide layer, becomes more serious. In order to solve these problems, research has been carried out on a method of using a high dielectric material as a gate dielectric layer. However, in the conventional techniques, source and drain regions are formed after a gate dielectric layer is formed, and thus there is a limit in a subsequent activation heat treatment process.

Therefore, a new method of fabricating an ultra small-sized device is required to realize an integrated circuit having a high integration density and high performances.

SUMMARY OF THE INVENTION

To solve the above and other problems, it is an aspect of the present invention to provide an ultra small-sized SOI MOSFET, which has high reliability and a high integration density, and a method of fabricating the same.

To achieve the above aspect of the present invention, there is provided a method of fabricating an ultra small-sized SOI MOSFET. The method includes preparing a SOI substrate on which a monocrystalline silicon layer is formed, forming a first dielectric material layer doped with impurities of a first conductivity type on the SOI substrate, forming an opening to expose the monocrystalline silicon layer etching at least part of the first dielectric material layer, forming a channel region injecting impurities of a second conductivity type into the monocrystalline silicon layer exposed by the opening, forming a source region and a drain region in the monocrystalline silicon layer diffusing the impurities of the first dielectric material layer using heat treatment, forming a gate dielectric layer in the opening on the channel region, forming a gate electrode on the gate dielectric layer to fit in the opening, forming a second dielectric material layer on the entire surface of the SOI substrate on which the gate electrode is formed, forming contact holes to expose the gate electrode, the source region, and the drain region etching part of the second dielectric material layer, and forming metal interconnections to bury the contact holes.

Preferably, the first material layer doped with the first conductivity-type impurities is a silicon oxide layer.

Preferably, the method may further include forming an oxide layer or a nitride layer on the first dielectric layer before the formation of the opening on the first dielectric material layer.

Preferably, the opening is formed in the first dielectric material layer using dry etching in order to control an etching angle, and thus the width of the opening is gradually decreasing toward a bottom surface of the dielectric material layer. Preferably, the sidewall of the opening and the top surface of the monocrystalline silicon layer forms an angle of no greater than 90° so as to reduce the length of the channel region.

Preferably, the source and drain regions are formed using rapid heat treatment so that they can contact the bottom surface of the monocrystalline silicon layer of the SOI substrate. Alternatively, the source and drain regions may be formed in the monocrystalline silicon layer so that there exists a predetermined distance between the bottom of the source and drain regions and the bottom surface of the monocrystalline silicon layer.

Preferably, the gate dielectric layer is formed of any of a silicon oxide layer thermally oxidized at low temperatures, an ozone oxide layer, a silicon nitride or silicon oxide layer deposited using CVD, and a high dielectric layer.

To achieve the above aspect of the present invention, there is provided an ultra small-sized SOI MOSFET manufactured using the aforementioned method.

Preferably, the first dielectric material layer doped with the first conductivity-type impurities is a silicon oxide layer. The gate electrode may be formed of polysilicon or any conductive materials.

Preferably, the opening is formed in the first dielectric material layer so that the width of the opening is gradually decreasing toward a bottom surface of the dielectric material layer.

Preferably, the gate dielectric layer is formed of any of a silicon oxide layer thermally oxidized at low temperatures, an ozone oxide layer, a silicon nitride or silicon oxide layer deposited using CVD, and a high dielectric layer.

According to the present invention, source/drain junctions are formed in advance using a first dielectric material layer having impurities, for example, a silicon oxide layer, and thus it is possible to form an ultra-fine channels without affecting photolithography using photomasks. In the present invention, an opening, the width of which is gradually decreasing toward its bottom, is formed by etching the silicon oxide layer with a predetermined etching angle, and then ions are implanted into a substrate to form channel regions, thus reducing the effective length of channels of a device. In addition, according to the present invention, it is possible to form ultra-shallow junctions by diffusing dopants from the silicon oxide layer having impurities into source/drain regions using a rapid heat treatment.

According to the present invention, the variation of the concentration of impurities can be minimized by decreasing heat treatment temperature after formation of a gate dielectric layer so that the threshold voltage of a device can be prevented from varying. Accordingly, it is possible to prevent the characteristics of a device from deteriorating due to a short channel effect.

In addition, since source and drain regions are formed by diffusing impurities from a solid-phase diffusing source, damage to the crystallization of a substrate does not occur, and it is possible to decrease the leakage current leaking through junctions.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF THE INVENTION

Figure 1:
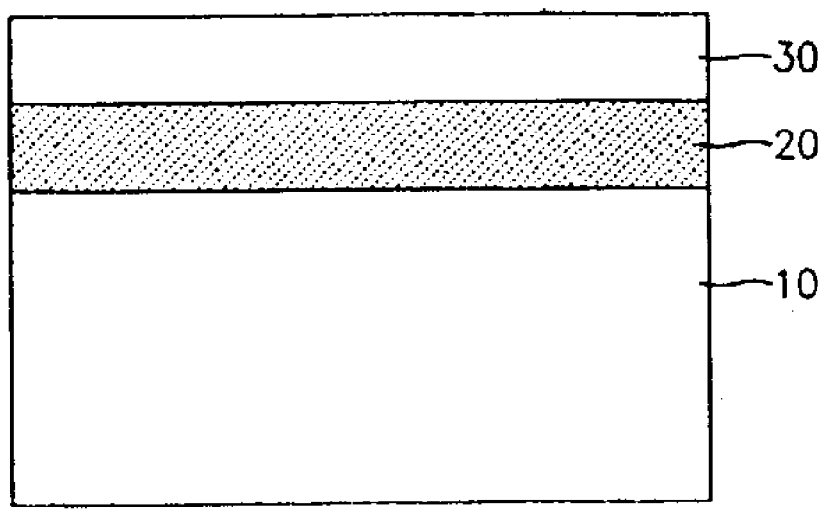
FIG. 1 is a cross-sectional view of a SOI substrate on which a monocrystalline silicon layer is formed for illustrating a method of fabricating an ultra small-sized SOI MOSFET according to the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIG. 1 is a cross-sectional view of a SOI substrate on which a monocrystalline silicon layer is formed for illustrating a method of fabricating an ultra small-sized SOI MOSFET according to the present invention. Referring to FIG. 1, a buried oxide layer 20 is formed on a base substrate 10, and a monocrystalline silicon layer 30 is formed on the buried oxide layer 20. Such a SOI substrate is formed using a silicon on sapphire (SOS) technique, in which a hetero epitaxial silicon layer is grown on sapphire, a separation by implanted oxygen (SIMOX) technique, in which oxygen ions are injected into a silicon substrate to form a buried silicon oxide layer, and a bonding SOI technique, In which at least one substrate on which a dielectric layer is formed is bonded to another wafer. In the present invention, SOI substrates formed by various manufacturing methods can be used. In other words, the present invention is not limited to a specific SOI manufacturing technique.

Figure 2:
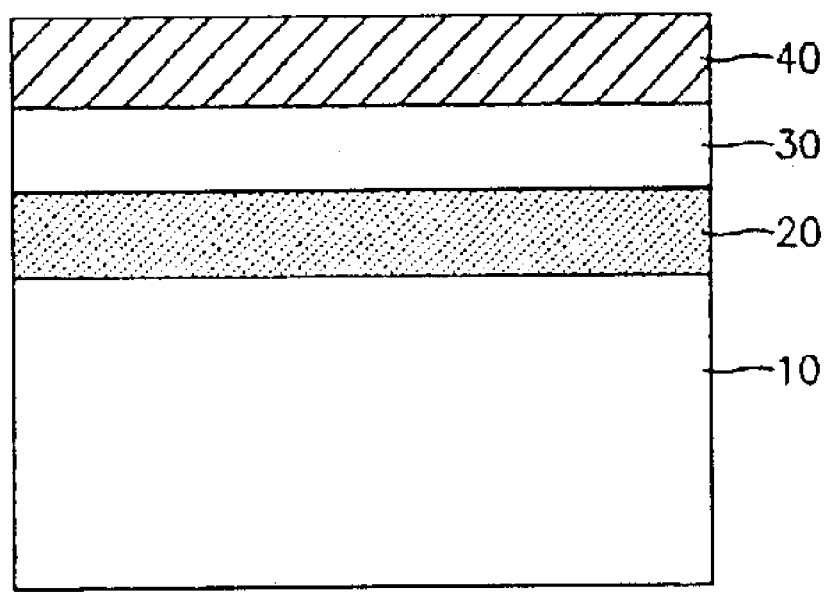
FIG. 2 is a cross-sectional view illustrating a step of forming a silicon oxide layer doping the monocrystalline silicon layer on the SOI substrate with impurities of high concentration in the method of fabricating an ultra small-sized SOI MOSFET according to the present invention.

FIG. 2 shows a step of forming a silicon oxide layer 40 doped with impurities of high concentration, such as boron, phosphorous, or arsenic, on the monocrystalline silicon layer 30 on the SOI substrate. The type of the impurities is dependent on the type of a MOSFET desired to be manufactured. In other words, in order to manufacture an NMOS transistor or a PMOS transistor, p-type impurities or N-type impurities can be used. The concentration of impurities can be optimally determined in consideration of the time duration and temperature of subsequent heat treatment and the thickness of the monocrystalline silicon layer 30. The silicon oxide layer 40 may be formed using spin coating or chemical vapor deposition (CVD). An oxide layer or a nitride layer which is not doped with impurities may be formed on the silicon oxide layer 40 doped with impurities of high concentration.

Figure 3:
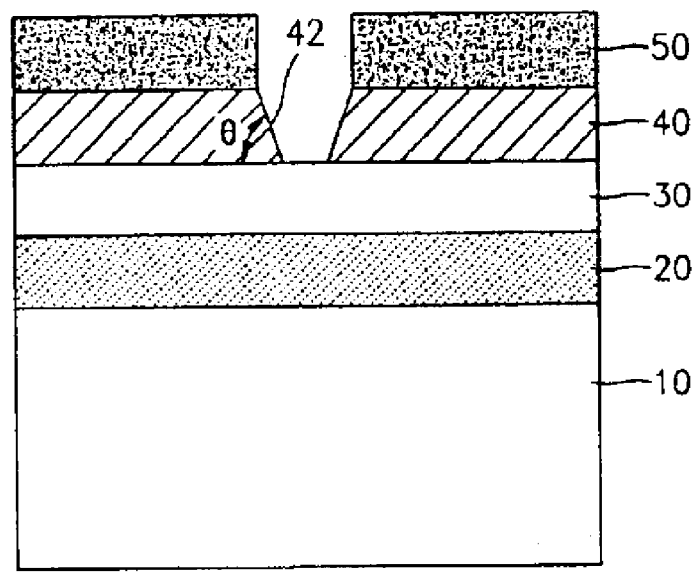
FIG. 3 is a cross-sectional view illustrating a step of forming an opening to expose the top surface of the monocrystalline silicon layer using photoresist patterns in the method of fabricating an ultra small-sized SOI MOSFET according to the present invention.

FIG. 3 shows a step of forming an opening 42 to expose the top surface of the monocrystalline silicon layer 40 using photoresist patterns 50. In particular, the silicon oxide layer 40 is coated with a photoresist layer, and the photoresist patterns 50 are formed to define the opening 42 on a region where MOS transistor channels will be formed using photolithography. Next, the silicon oxide layer 40 is etched using the photoresist patterns 50 as etching masks. The silicon oxide layer 40 is etched using dry etching so that the width of the opening may be gradually decreasing toward the bottom surface of the silicon oxide layer 40 and the sidewall of the opening 42 may form an inclination angle θ of no greater than 90° with the top surface of the monocrystalline silicon layer 30.

The area of the bottom of the opening 42 is dependent on the inclination angle θ of the opening 42. Thus, it is possible to control the effective length of a channel in a channel region formed under the photoresist patterns 50 according to the inclination angle θ of the opening 42.

Figure 4:
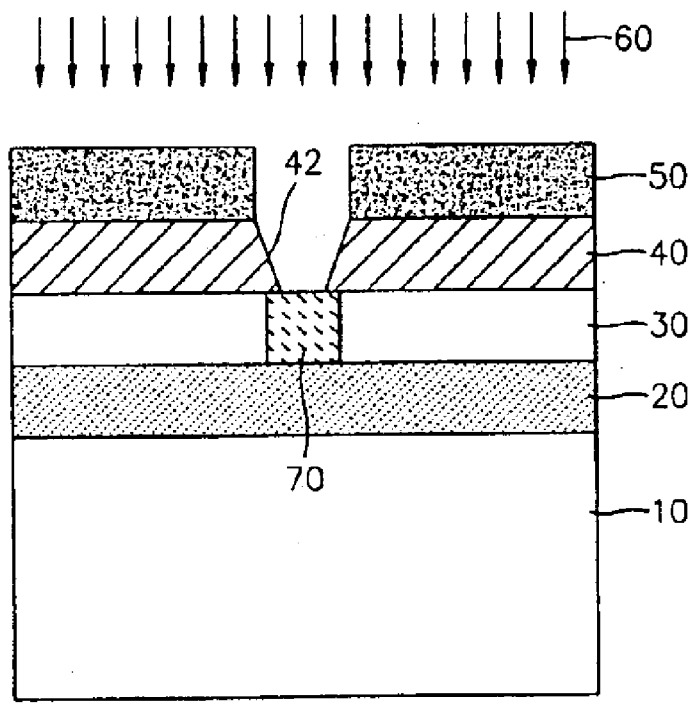
FIG. 4 is a cross-sectional view illustrating a step of forming a channel region implanting impurities into the monocrystalline silicon layer exposed through the opening in the method of fabricating an ultra small-sized SOI MOSFET according to the present invention.

FIG. 4 shows a step of forming an impurity injection layer 70 implanting impurity ions 60 into the monocrystalline silicon layer 30 exposed through the opening 42. The impurity ions 60 have a different type from the impurity ions doped on the silicon oxide layer 40.

Figure 5:
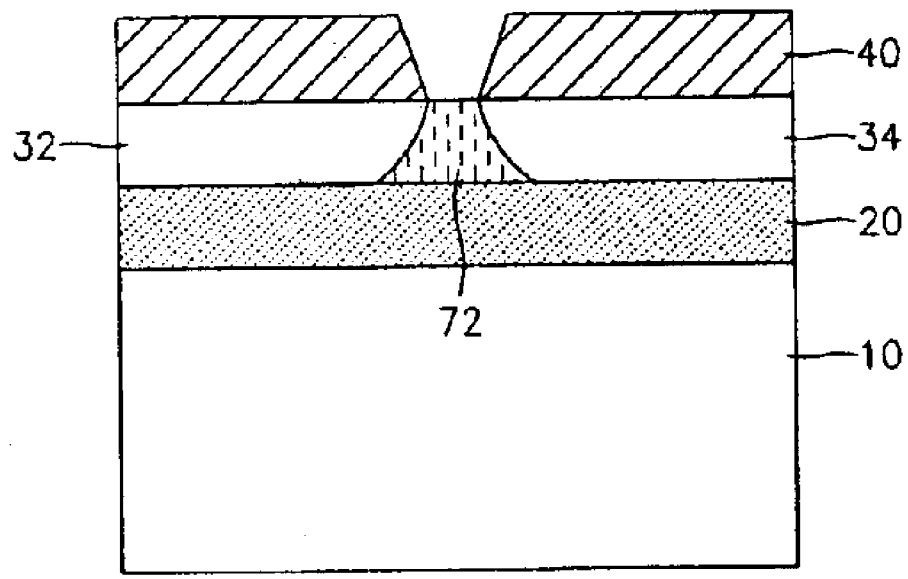
FIG. 5 is a cross-sectional view illustrating a step of forming source and drain regions using heat treatment in the method of fabricating an ultra small-sized SOI MOSFET according to the present invention.

FIG. 5 shows a step of forming a channel region 72 and source and drain regions 32 and 34 using heat treatment. In particular, rapid heat treatment is performed on the SOI substrate on which the silicon oxide layer 40 doped with impurities of high concentration and the impurity injection layer 70 have been formed. As a result of the rapid heat treatment, the impurity ions doped on the silicon oxide layer 40 diffuse into the monocrystalline silicon layer. 30 under the silicon oxide layer 40, thus forming the source and drain regions 32 and 34. In addition, the ions injected into the impurity injection layer 70 are activated, thus forming the channel region 72. The time duration and temperature of the rapid heat treatment are determined depending on the type and concentration of he impurity ions doped on the silicon oxide layer 40, and the rapid heat treatment is performed under optimal conditions so as to obtain a preferable threshold voltage from a device. The source region 32 and the drain region 34 may be formed to be deep enough to contact the surface of the buried oxide layer 20 or may be formed to be shallow so as not to contact the surface of the buried oxide layer 20.

Figure 6:
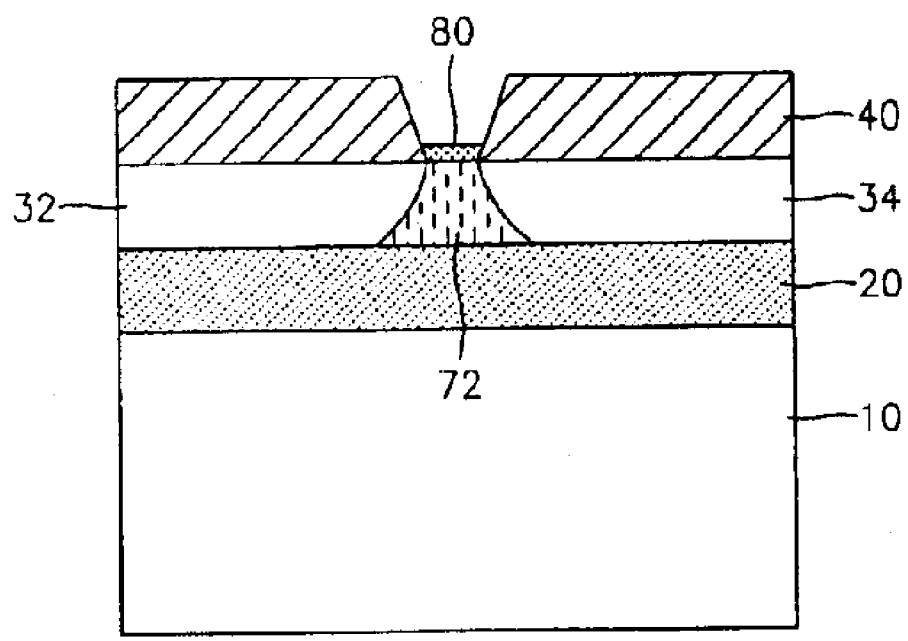
FIG. 6 is a cross-sectional view illustrating a step of forming a gate dielectric layer in the channel region in the method of fabricating an ultra small-sized SOI MOSFET according to the present invention.

FIG. 6 shows a step of forming a gate dielectric layer 80 on the channel region 72. The gate dielectric layer 80 may be formed of any of a silicon oxide layer thermally oxidized at low temperatures, an ozone oxide layer, silicon oxide and nitride layers deposited using CVD, and a high dielectric layer.

Figure 7:
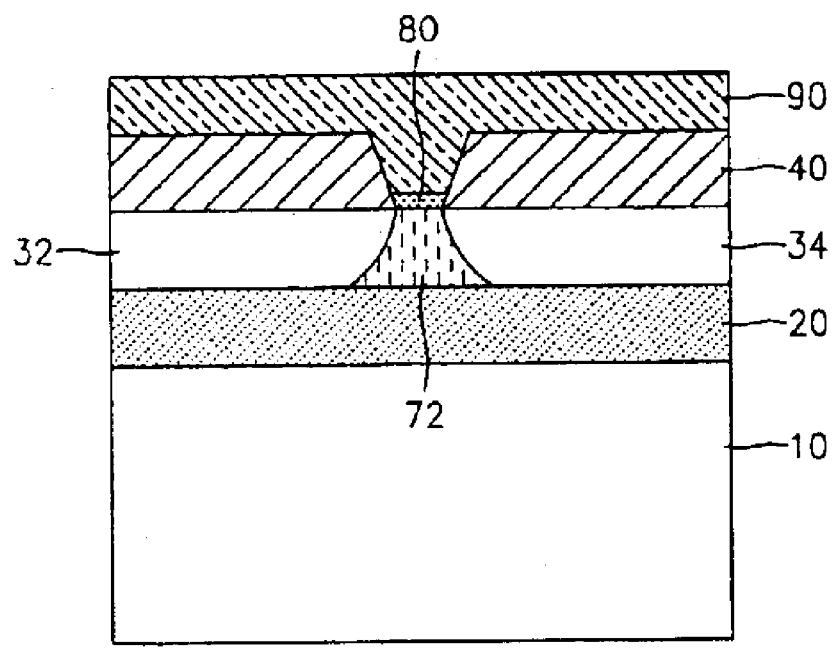
FIG. 7 is a cross-sectional view illustrating a step of forming a gate conductive layer on the substrate where the gate dielectric layer has been formed in the method of fabricating an ultra small-sized SOI MOSFET according to the present invention.

FIG. 7 shows a step of forming a gate conductive layer 90 on the SOI substrate on which the gate dielectric layer 80 has been formed. In particular, the gate conductive layer 90, for example, a polysilicon layer or a metal gate electrode material layer, is formed on the entire surface of the SOI substrate on which the gate dielectric layer 80 has been formed.

Figure 8:
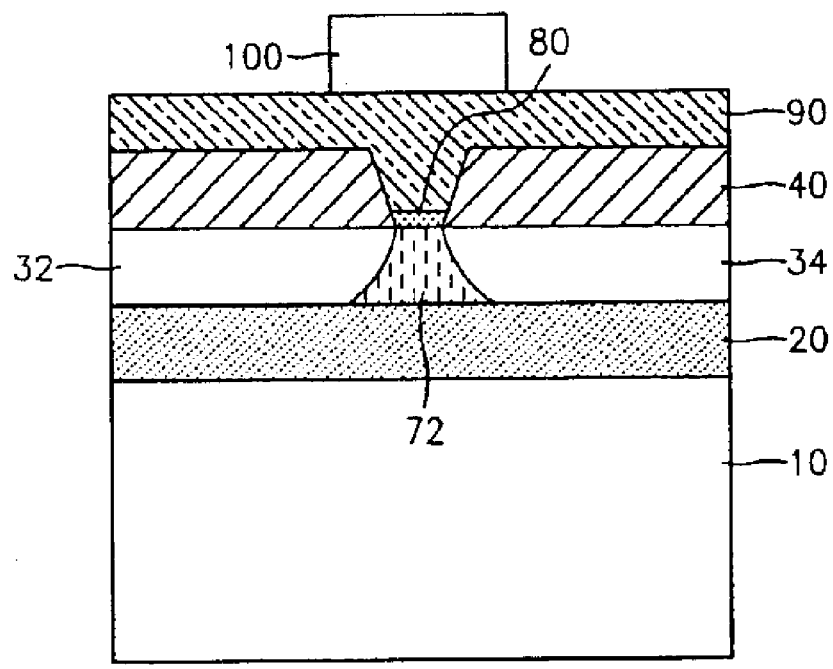
FIG. 8 is a cross-sectional view illustrating a step of forming photoresist patterns on the gate conductive layer in the method of fabricating an ultra small-sized SOI MOSFET according to the present invention.

FIG. 8 shows a step of forming photoresist patterns 100 on the gate conductive layer 90. In particular, the entire surface of the SOI substrate on which the gate conductive layer 90 has been formed is coated with a photoresist layer, and the photoresist patterns 100 are formed to define a gate electrode using photolithography.

Figure 9:
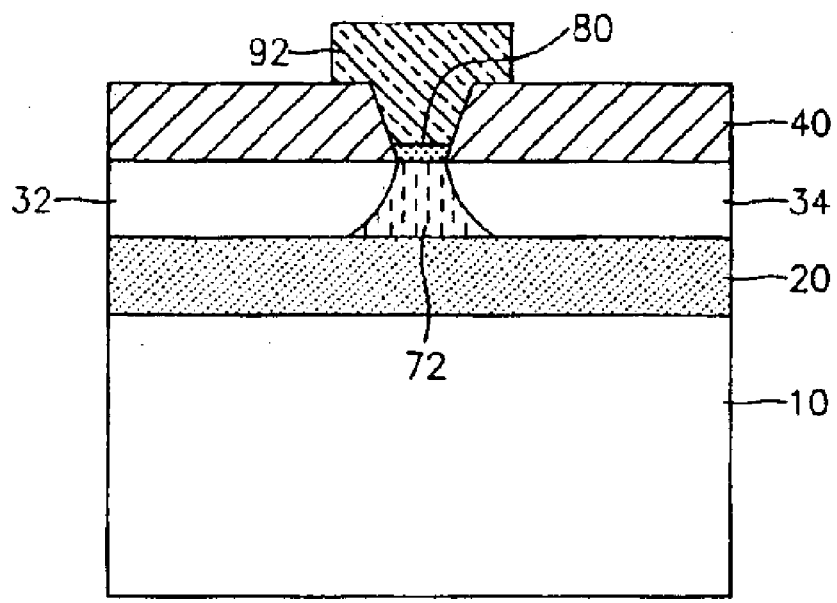
FIG. 9 is a cross-sectional view illustrating a step of forming a gate electrode in the method of fabricating an ultra small-sized SOI MOSFET according to the present invention.

FIG. 9 shows a step of forming a gate electrode 92. In particular, the gate conductive layer 90 is etched using the photoresist patterns 100 as etching masks, thus forming the gate electrode 92, and then the remaining photoresist patterns 100 are removed.

Figure 10:
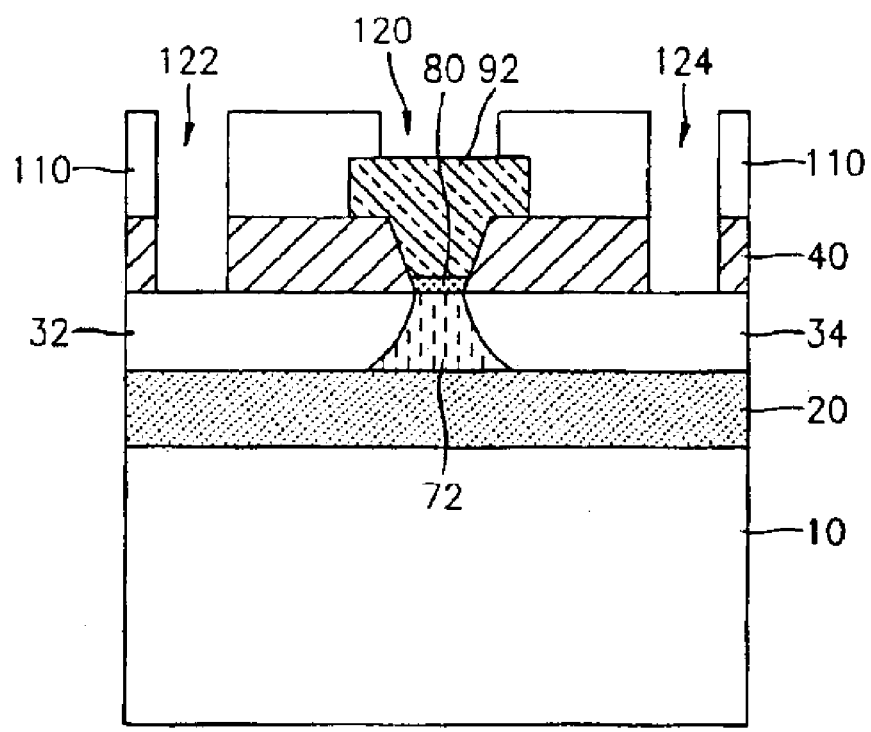
FIG. 10 is a cross-sectional view illustrating a step of forming an interlayer dielectric layer on the substrate where the gate electrode has been formed and forming contact holes in the method of fabricating an ultra small-sized SOI MOSFET according to the present invention.

FIG. 10 shows a step of forming an interlayer dielectric layer 110 on the SOI substrate on which the gate electrode 92 has been formed and forming contact holes 120, 122, and 124. In particular, the interlayer dielectric layer 110, for example, a silicon oxide layer, is deposited to be thick, and photoresist patterns (not shown) are formed using photolithography. Next, the first contact hole. 120, the second contact hole 122, and the third contact hole 124 are formed to expose the gate electrode 92, the source region 32, and the drain region 34, respectively. Even when the gate electrode 92 is not etched after the interlayer dielectric layer 110 is etched, the silicon oxide layer 40 on the source and drain regions 32 and 34 is continuously etched until the source and drain regions 32 and 34 are exposed. In the step described with reference to FIG. 7, a gate mask layer (not shown), for example, a silicon nitride layer, may be further formed at the surface of the gate electrode 92 in order to prevent the surface of the gate electrode 92 from being damaged or deformed and to let the gate electrode 92 have an etching selectivity with respect to the silicon oxide layer 40.

Figure 11:
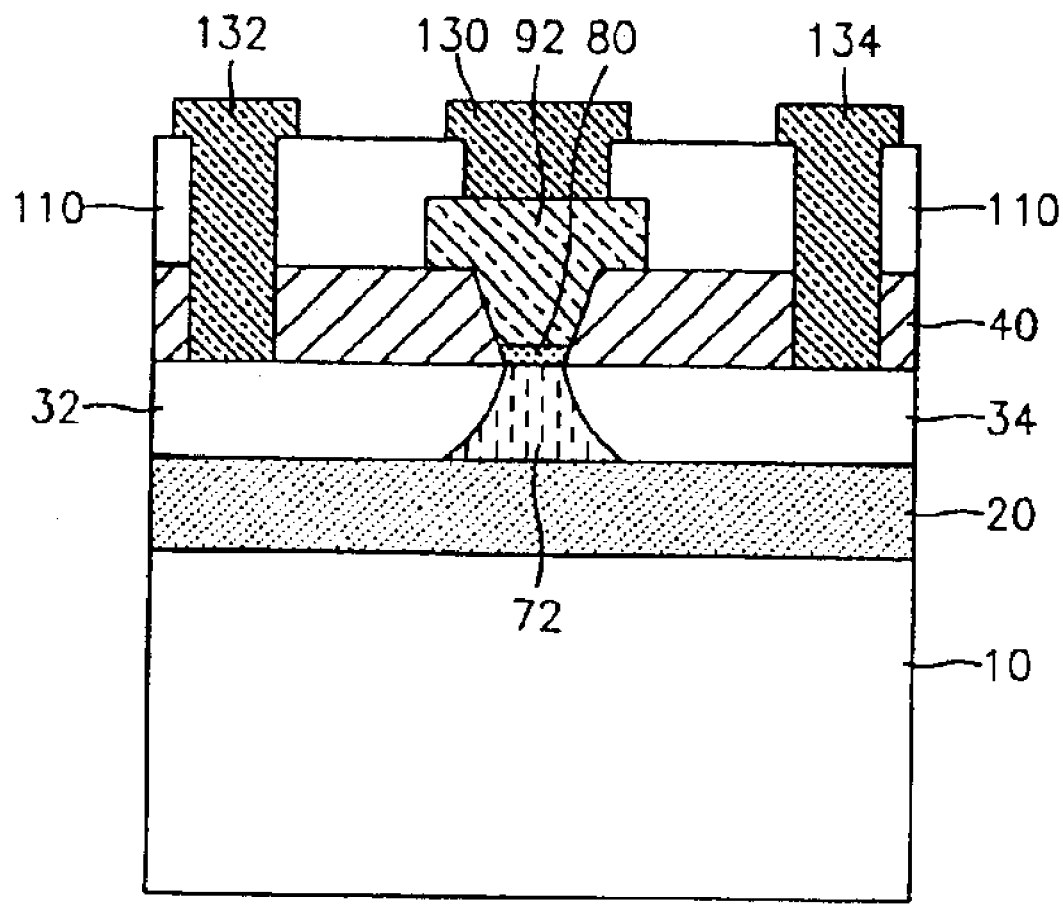
FIG. 11 is a cross-sectional view illustrating a step of forming metal interconnection in the contact holes in the method of fabricating an ultra small-sized SOI MOSFET according to the present invention.

FIG. 11 is a cross-sectional view of an ultra small-sized SOI MOSFET fabricated according to the present invention, for illustrating a step of forming metal interconnections 130, 132, and 134 in the contact holes 120, 122, and 124, respectively. In particular, a certain material for metal interconnections is deposited on the entire surface of the SOI substrate, in which the contact holes 120, 122, and 124 have been formed, and is patterned. Next, the metal interconnections 130, 132, and 134 are isolated from one another, thus completing an ultra small-sized SOI MOSFET.

According to the present invention, source/drain junctions are formed in advance using a first dielectric material layer having impurities, for example, a silicon oxide layer. Accordingly, it is possible to form ultra fine channels of several nano meters without affecting a photomask process and a photolithography process.

Since an opening having a smaller width at its bottom than at its top is formed etching a silicon oxide layer having impurities to have a certain inclination angle and then ions are implanted to form a channel region, the effective length of channels of a device can be decreased. In addition, it is possible to form ultra shallow junctions diffusing dopants into source and drain regions from the silicon oxide layer using rapid heat treatment.

In addition, according to the present invention, the threshold voltage of a device can be prevented from considerably varying decreasing the temperature of heat treatment after formation of a gate dielectric layer and thus minimizing the variation in the concentration of impurities in the channel region. Therefore, it is possible to prevent the characteristics of a device from deteriorating due to a short channel effect.

Moreover, since the source and drain regions are formed by diffusing impurities from a solid-phase diffusing source, the crystallization of a substrate is not damaged, and it is possible to decrease leakage current leaking through junctions.

Therefore, the ultra small-sized SOI MOSFET and the method of fabricating the same can be very effective in manufacturing a SOI MOSFET device or a circuit which is required to have ultra fine channels of a high integration density and to show low power consumption with high performances.

While this invention has been particularly shown and described with reference to preferred embodiments thereof, it will be understood by those skilled in the art that various changes in form and details may be made therein without departing from the spirit and scope of the invention as defined by the appended claims and equivalents thereof.

What is claimed is:

1. A method of fabricating an ultra small-sized SOI MOSFET comprising:

preparing a SOI substrate on which a monocrystalline silicon layer is formed;

forming a first dielectric material layer doped with impurities of a first conductivity type on the SOI substrate;

forming an opening to expose the monocrystalline silicon layer etching at least part of the first dielectric material layer;

forming a channel region injecting impurities of a second conductivity type into the monocrystalline silicon layer exposed by the opening;

forming a source region and a drain region in the monocrystalline silicon layer diffusing the impurities of the first dielectric material layer using heat treatment;

forming a gate dielectric layer in the opening on the channel region;

forming a gate electrode on the gate dielectric layer to fit in the opening;

forming a second dielectric material layer on the entire surface of the SOI substrate on which the gate electrode is formed;

forming contact holes to expose the gate electrode, the source region, and the drain region etching part of the second dielectric material layer; and forming metal interconnections to bury the contact holes.

2. The method of claim 1, wherein the first material layer doped with the first conductivity-type impurities is a silicon oxide layer.

3. The method of claim 2 further comprising forming an oxide layer or a nitride layer on the first dielectric layer before the formation of the opening on the first dielectric material layer.

4. The method of claim 1, wherein the opening is formed in the first dielectric material layer using dry etching in order to control an etching angle, and thus the width of the opening is gradually decreasing toward a bottom surface of the dielectric material layer.

5. The method of claim 1, wherein the source and drain regions are formed using rapid heat treatment so that they can contact the bottom surface of the monocrystalline silicon layer of the SOI substrate.

6. The method of claim 1, wherein the gate dielectric layer is formed of any of a silicon oxide layer thermally oxidized at low temperatures, an ozone oxide layer, a silicon nitride or silicon oxide layer deposited using CVD, and a high dielectric layer.

7. The SOI MOSFET of claim 1, wherein the gate dielectric layer is formed of any of a silicon oxide layer thermally oxidized at low temperatures, an ozone oxide layer, a silicon oxide or silicon oxide layer deposited using CVD, and a high dielectric layer.

* * * * *